(12) United States Patent
Park

(10) Patent No.: US 9,691,776 B2
(45) Date of Patent: Jun. 27, 2017

(54) NONVOLATILE MEMORY DEVICE

(71) Applicant: SK hynix Inc., Gyeonggi-do (KR)

(72) Inventor: Sung-Kun Park, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/612,014

(22) Filed: Feb. 2, 2015

(65) Prior Publication Data

US 2015/0145019 A1  May 28, 2015

Related U.S. Application Data

(63) Continuation-in-part of application No. 14/056,542, filed on Oct. 17, 2013.

(30) Foreign Application Priority Data

Jun. 13, 2013 (KR) ........................ 10-2013-0067738

(51) Int. Cl.
| | | |
|---|---|---|
| H01L 29/788 | (2006.01) | |
| H01L 27/11521 | (2017.01) | |
| H01L 29/423 | (2006.01) | |
| H01L 27/11519 | (2017.01) | |
| H01L 27/11543 | (2017.01) | |

(52) U.S. Cl.
CPC .. *H01L 27/11521* (2013.01); *H01L 27/11519* (2013.01); *H01L 27/11543* (2013.01); *H01L 29/42324* (2013.01); *H01L 29/42328* (2013.01); *H01L 29/7881* (2013.01)

(58) Field of Classification Search
CPC ......... H01L 27/11519; H01L 27/11521; H01L 29/42324; H01L 29/42328; H01L 29/42332; H01L 29/42336; H01L 29/42372; H01L 29/42376; H01L 29/4238;
(Continued)

(56) References Cited

U.S. PATENT DOCUMENTS 5,255,219 A  10/1993  Sakai
6,465,833 B1  10/2002  Jung et al.
(Continued)

FOREIGN PATENT DOCUMENTS

KR  1020050005057  1/2005
KR  1020140081398  7/2014

OTHER PUBLICATIONS

Sung, H., et al., Novel Single-Poly EEPROM With Damascene Control-Gate Structure, IEEE Electron Device Letters, Oct. 2005, pp. 770-772, vol. 26, No. 10.
(Continued)

*Primary Examiner* — Mohammed Shamsuzzaman
(74) *Attorney, Agent, or Firm* — IP & T Group LLP

(57) ABSTRACT

A nonvolatile memory device may include: an isolation layer formed in a substrate and defining an active region; a control plug formed over the isolation layer; a floating gate formed over the substrate and including a plurality of fingers adjacent to the control plug with a gap provided therebetween; and a charge blocking layer formed on sidewalls of the floating gate so as to fill the gap. The control plug may include: a first control plug formed between the plurality of fingers and having sidewalls facing inner walls of the fingers; and a second control plug formed outside the floating gate and having sidewalls facing outer walls of the fingers.

14 Claims, 8 Drawing Sheets

(58) Field of Classification Search
CPC ........... H01L 29/7881; H01L 27/11543; G04B 17/045; G04C 5/005
USPC ................. 257/316, 315; 365/185.18, 185.08
See application file for complete search history.

(56) References Cited

U.S. PATENT DOCUMENTS

| | | | |
|---|---|---|---|
| 6,696,724 B2 | 2/2004 | Verhaar | |
| 6,788,576 B2 * | 9/2004 | Roizin | G11C 16/0441 257/E21.422 |
| 7,259,419 B2 | 8/2007 | Koo et al. | |
| 7,671,396 B2 * | 3/2010 | Fenigstein | H01L 27/105 257/298 |
| 7,746,696 B1 * | 6/2010 | Paak | G11C 16/0441 365/185.05 |
| 7,859,043 B2 * | 12/2010 | Pikhay | G11C 16/0441 257/314 |
| 7,880,215 B2 | 2/2011 | Watanabe et al. | |
| 8,436,411 B2 | 5/2013 | Lin et al. | |
| 8,890,230 B2 | 11/2014 | Hsu et al. | |
| 2006/0157773 A1 | 7/2006 | Yu et al. | |
| 2014/0145293 A1 * | 5/2014 | Jain | G11C 11/4125 257/499 |
| 2014/0312405 A1 * | 10/2014 | Park | H01L 29/7881 257/316 |
| 2015/0054053 A1 * | 2/2015 | Park | H01L 29/7881 257/316 |
| 2015/0069486 A1 * | 3/2015 | Park | H01L 27/11521 257/315 |
| 2015/0129949 A1 * | 5/2015 | Park | H01L 29/66825 257/316 |
| 2015/0228343 A1 * | 8/2015 | Park | H01L 29/42328 365/185.18 |

OTHER PUBLICATIONS

Lien, C., et al., A New 2T Contact Coupling Gate MTP Memory in Fully CMOS Compatible Process, IEEE Transactions on Electron Devices, Jul. 2012, pp. 1899-1905, vol. 59, No. 7.

Notice of Allowance issued by the USPTO for the parent U.S. Appl. No. 14/056,542 on Dec. 4, 2015.

Office Action issued by the USPTO for the parent U.S. Appl. No. 14/056,542 on Dec. 26, 2014.

* cited by examiner

FIG. 6

| METHOD | | CONTROL PLUG | FIRST CONTACT PLUG | SECOND CONTACT PLUG | SELECT GATE | FIRST WELL (WELL TAP) |
|---|---|---|---|---|---|---|
| PROGRAM | FN tunneling | 5.5 | -5.5 | Floating | -5.5 | -5.5 |
| ERASE | FN tunneling | -5.5 | 5.5 | Floating | 5.5 | 5.5 |
| READ | - | 1.5 | 1 | GND | 3.3 | GND |

NONVOLATILE MEMORY DEVICE

CROSS-REFERENCE TO RELATED APPLICATIONS

The present application is a continuation-in-part of U.S. patent application Ser. No. 14/056,542, filed on Oct. 17, 2013, which claims priority of Korean Patent Application No. 10-2013-0067738, filed on Jun. 13, 2013. Each of these applications is incorporated herein by reference in its entirety.

BACKGROUND

The present invention relates to a semiconductor device fabrication technology, and more particularly, to a nonvolatile memory device.

A variety of digital media devices which have recently emerged have created a living environment in which information can be conveniently used anytime and anywhere. The digital media devices which have rapidly spread as the analog environment is switched to the digital environment require a storage medium capable of conveniently storing taken images, recorded music, and various data. Thus, in the non-memory semiconductor industry, much attention has been paid to the SoC (System on Chip) field according to the high integration trend. Also, many semiconductor makers are investing in enhancing the SoC-based technology. The SoC refers to a technology for integrating all system techniques on one semiconductor. When a system design technology is not secured, it will be difficult to develop a non-memory semiconductor. In the SoC field in which complex techniques are integrated, a chip having a complex function in which digital circuits and analog circuits are mixed has recently emerged as mainstream. Thus, there is an increasing demand for an embedded memory capable of trimming an analog device or storing an internal operation algorithm.

However, since the embedded memory is fabricated on the basis of a COMS process or logic process for forming a logic circuit, it is difficult to improve the integration degree.

SUMMARY

Various embodiments are directed to a nonvolatile memory device of the integration degree is improved.

In an embodiment, a nonvolatile memory device may include: an isolation layer formed in a substrate and defining an active region; a control plug formed over the isolation layer; a floating gate formed over the substrate and including a plurality of fingers adjacent to the control plug with a gap provided therebetween; and a charge blocking layer formed on sidewalls of the floating gate so as to fill the gap. The control plug may include: a first control plug formed between the plurality of fingers and having sidewalls facing inner walls of the fingers; and a second control plug formed outside the floating gate and having sidewalls facing outer walls of the fingers.

The nonvolatile memory device may further include: a well formed in the substrate; a well tap defined by the isolation layer; and a select gate formed over the active region. A part of the floating gate may be extended over the active region from the plurality of fingers over the isolation layer, and the floating gate over the active region may be separated at a predetermined interval from the select gate. The well tap and the active region may have a bar shape, and the major-axis direction of the well tap and the major-axis direction of the active region may cross each other.

The control plug may include one or more plugs having sidewalls facing the sidewalls of the floating gate. The plurality of fingers, the control plug, and the active region may be formed in a bar shape, and have the same major-axis direction. The first control plug and the second control plug may have the same length, or the second control plug may have a larger length than the first control plug. The charge blocking layer may include an insulating layer, and has a spacer shape.

In an embodiment, there is provided a nonvolatile memory device including a cell array in which a plurality of unit cells are two-dimensionally arranged. Each of the unit cells may include: a well formed in a substrate; an isolation layer formed in the substrate and defining an active region; a control plug formed over the isolation layer; a floating gate formed over the substrate and including a plurality of fingers adjacent to the control plug with a gate provided therebetween; and a charge blocking layer formed on the sidewalls of the floating gate so as to fill the gap. The cell array may include: a memory set including two unit cells sharing one active region in a first direction and the well tap positioned at both ends thereof; and a plurality of memory groups each including the plurality of memory sets arranged to be separated at a predetermined interval from each other in a second direction crossing the first direction, and the plurality of memory groups may be arranged to be symmetrical with each other, based on the well tap.

Each of the unit cells may further include a select gate over the active region. The select gates of the plurality of memory sets in the memory group may be coupled in the second direction so as to form a select line.

The active region, the plurality of fingers, and the control plug may have a bar shape of which the major axis is extended in the first direction, and the well tap may have a bar shape of which the major axis is extended in the second direction. The control plug may include one or more plugs having sidewalls facing the sidewalls of the floating gate. The control plug may include: a first control plug formed between the plurality of fingers and having sidewalls facing inner walls of the fingers; and a second control plug formed outside the floating gate and having sidewalls facing outer walls of the fingers. The first control plug and the second control plug may have the same length, or the second control plug may have a larger length than the first control plug. Unit cells adjacent in the second direction in the memory group may share the second control plug. The active region in the memory set may include a shape in which active regions of two unit cells are coupled to share a source region. The well taps of the plurality of memory sets in the memory group may be coupled in the second direction so as to have a line shape.

BRIEF DESCRIPTION OF THE DRAWINGS

FIG. 6 is a table showing an operating condition of the nonvolatile memory device in accordance with the embodiment.

DETAILED DESCRIPTION

Figure 1:
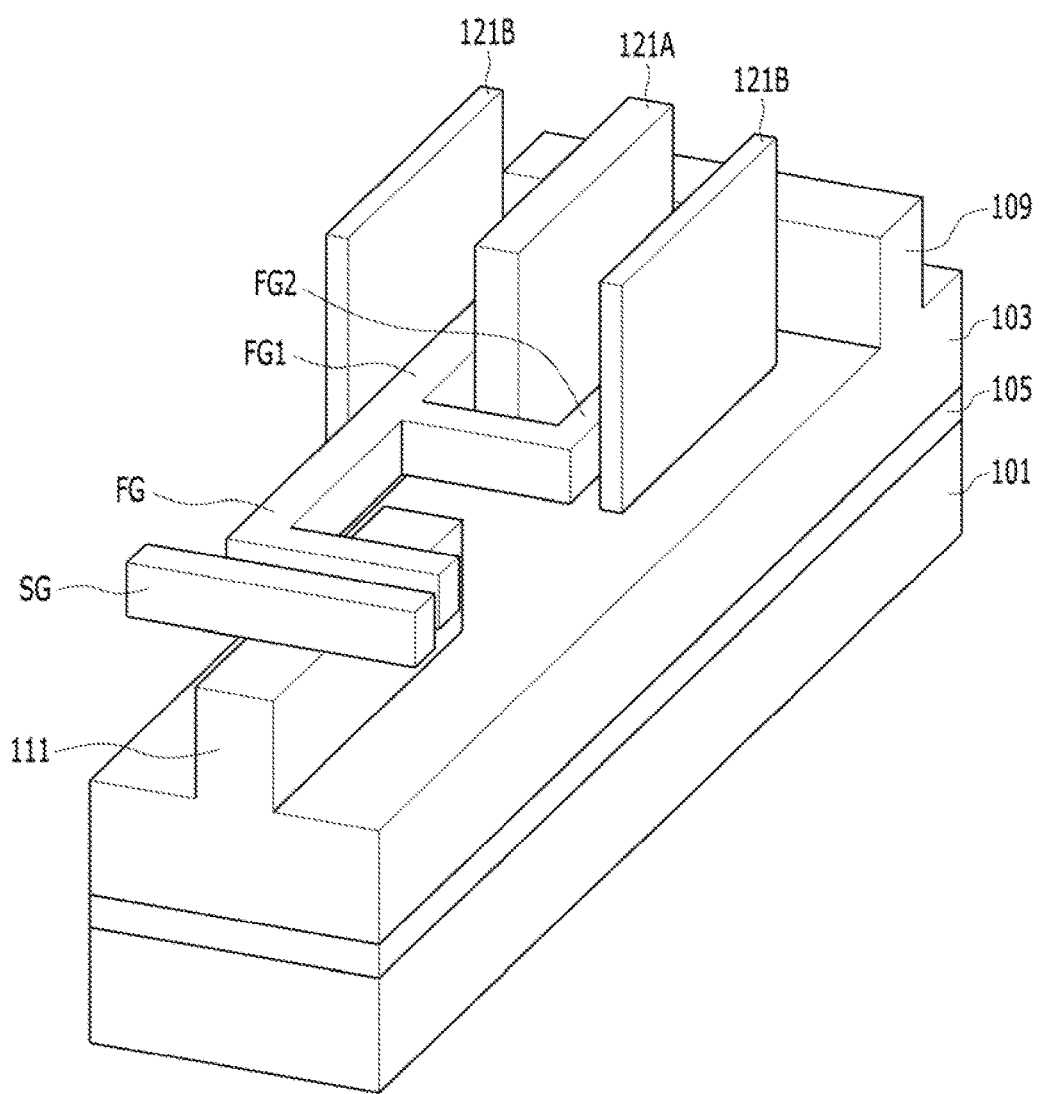
FIG. 1 is a perspective view illustrating a unit cell of a nonvolatile memory device in accordance with an embodiment.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

The following embodiments provide a nonvolatile memory device which can be easily applied to an embedded memory that attracts much attention in the SoC (System on Chip) field in which complex techniques are integrated. Specifically, the embodiments provide a nonvolatile memory device including a flash EEPROM (Flash Electrically Erasable Programmable Read-Only Memory) which can be easily applied to an embedded memory, in order to improve an integration degree. For reference, the flash EEPROM is a nonvolatile memory device which can store data even in a state where no power is provided, and electrically erase and program data, like a read-only memory (ROM). The flash EEPROM may include a single gate EEPROM which includes only a floating gate, a stack gate EEPROM in which a floating gate and a control gate are vertically stacked, a dual gate EEPROM corresponding to an intermediate form between the single gate EEPROM and the stack gate EEPROM, and a split gate EEPROM.

The single gate EEPROM may be fabricated according to a logic process, without a separate additional process. However, the single gate EEPROM may require a well structure with a large area (for example, an active control gate (ACG)) in order to secure a coupling ratio requested by a device, and must include independent units (or components) for programming and erasing operations. Thus, the single gate EEPROM inevitably has a low integration degree. On the other hand, since the stack gate EEPROM, the dual gate EEPORM, and the split gate EEPROM can easily secure a coupling ratio required by a device, the stack gate EEPROM, the dual gate EEPORM and the split gate EEPROM may easily increase the integration degree. However, due to an additional process requiring several to several tens of photomasks in addition to predetermined logic processes, the productivity of the stack gate EEPROM, the dual gate EEPORM, and the split gate EEPROM may be degraded, and there are difficulties in applying the stack gate EEPROM, the dual gate EEPORM, and the split gate EEPROM to an embedded memory.

Thus, the following embodiments provide a nonvolatile memory device including a control plug which is formed through a contact plug formation process used as one of predetermined logic processes and serves as a control gate for a floating gate. Thus, following embodiments can provide a nonvolatile memory device which can be fabricated without an additional process and of which the integration degree is improved.

In the following descriptions, first and second conductive types may indicate conductive types which are complementary to each other. That is, when the first conductive type is a P-type, the second conductive type is an N-type, and when the first conductive type is an N-type, the second conductive type is a P-type. This may indicate that nonvolatile memory devices in accordance with the embodiments can be applied to both of an N-channel type and a P-channel type. In the following descriptions, the first conductive type may be set to the P-type, and the second conductive type may be set to the N-type, for convenience of description. That is, an N-channel type nonvolatile memory device will be taken as an example for description.

Figure 2:
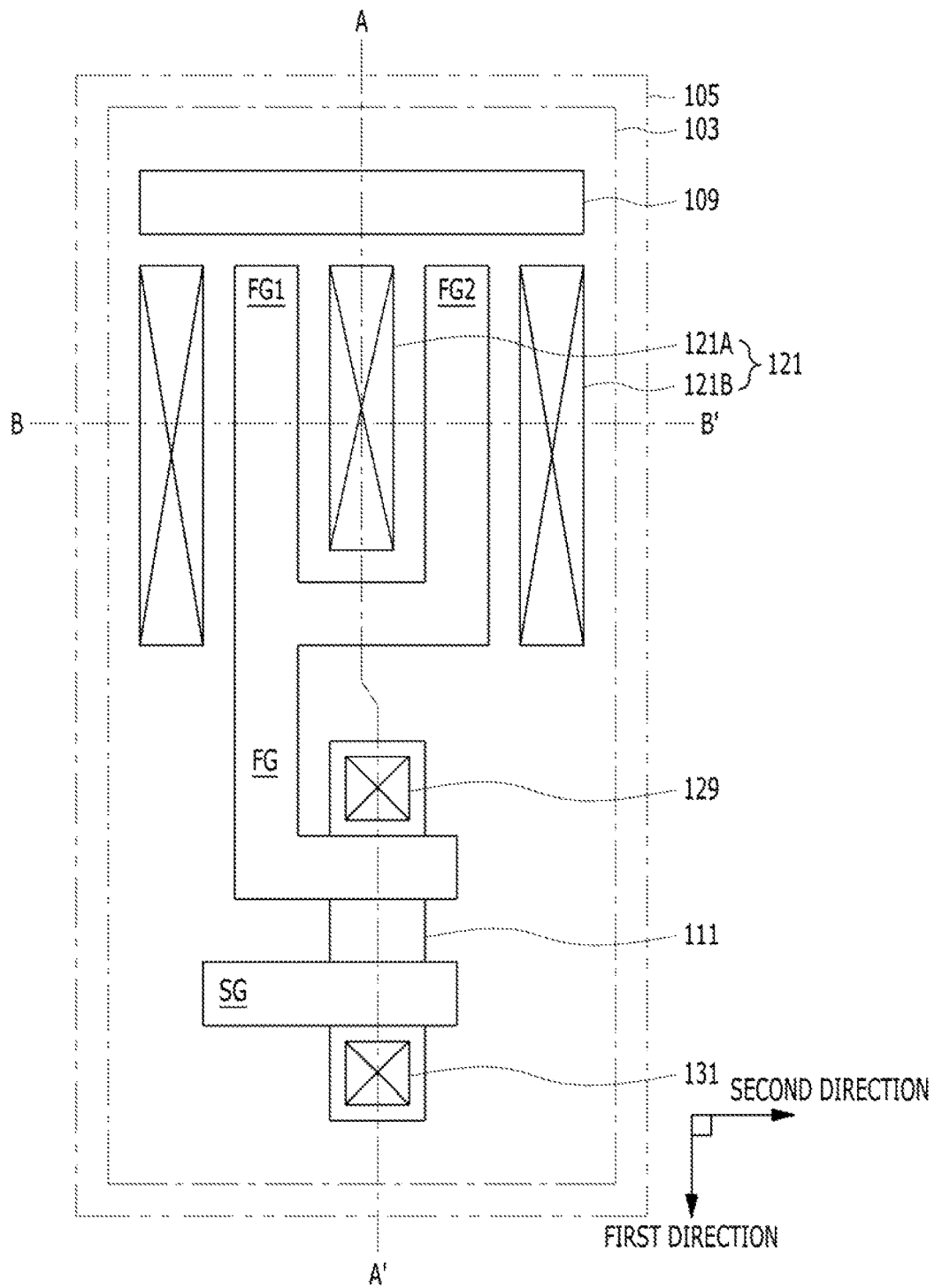
FIG. 2 is a plan view illustrating the unit cell of the nonvolatile memory device in accordance with the embodiment.
Figure 3:
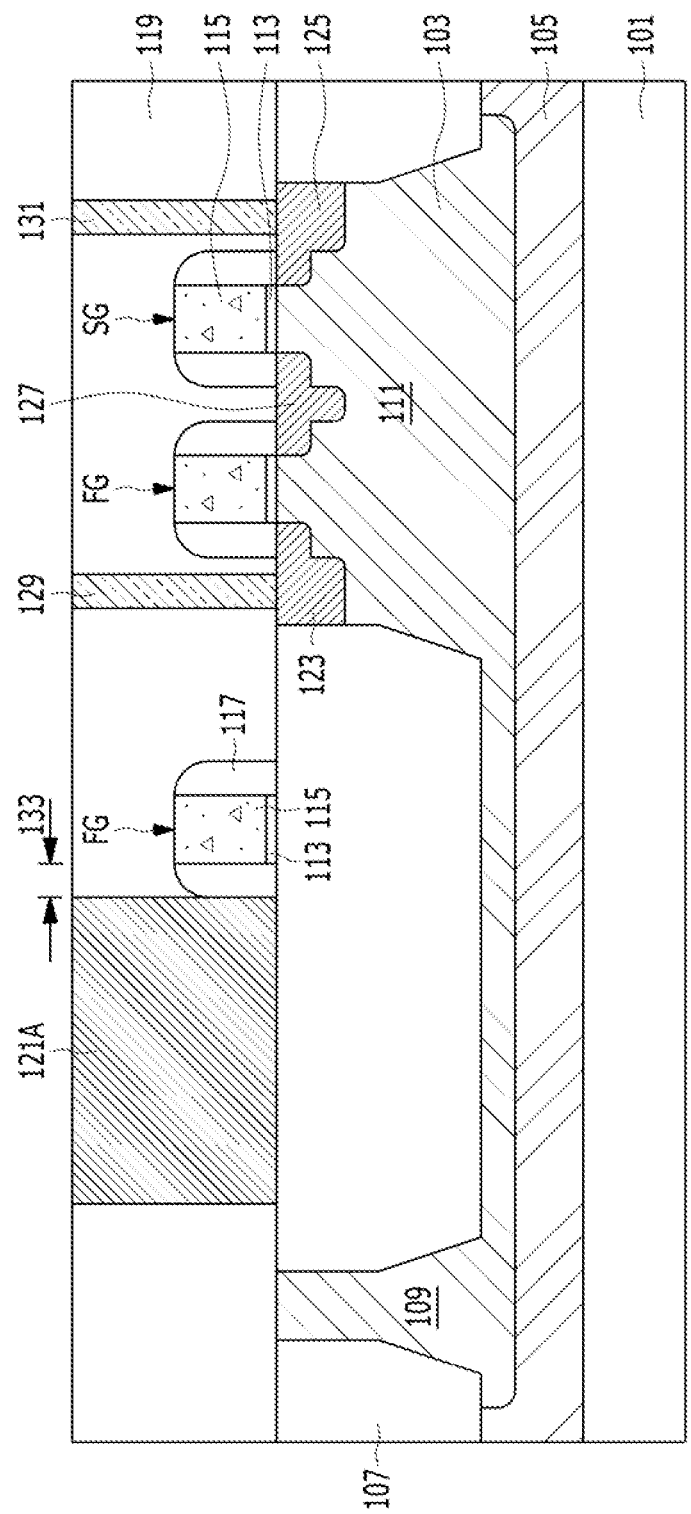
FIGS. 3 and 4 are cross-sectional views of the unit cell of the nonvolatile memory device in accordance with the embodiment, taken along line A-A' and line B-B' of FIG. 2.
Figure 4:
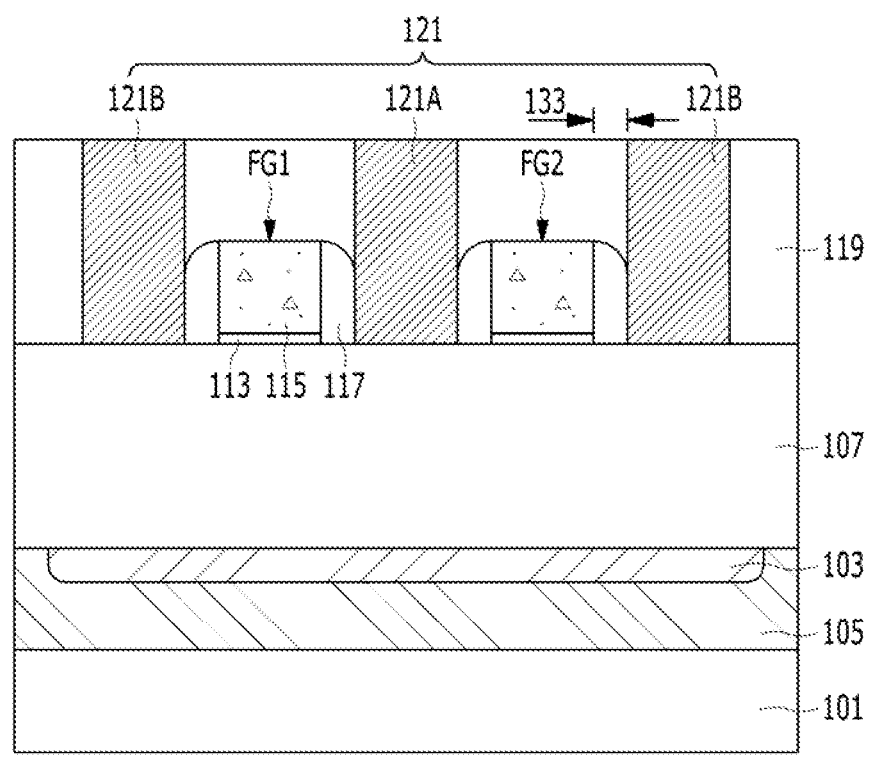
Figure 5:
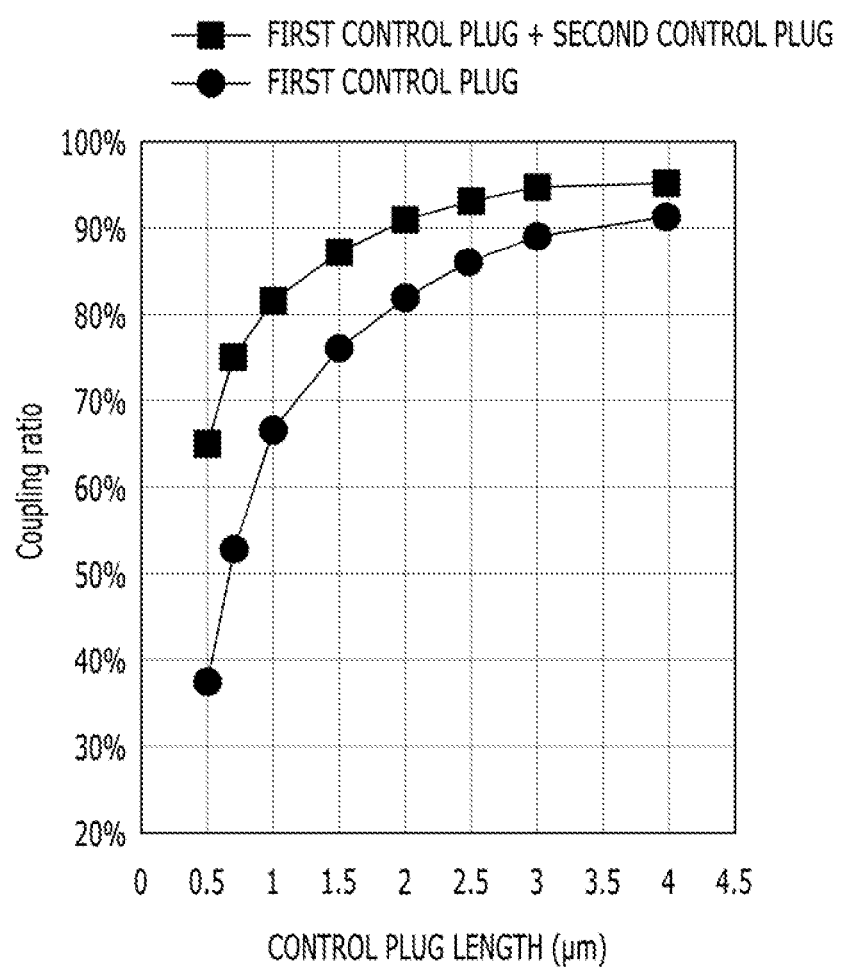
FIG. 5 is a graph illustrating a coupling ratio based on the length of a control plug in the nonvolatile memory device in accordance with the embodiments.

FIGS. 1 to 4 are diagrams illustrating a unit cell of a nonvolatile memory device in accordance with an embodiment. Specifically, FIG. 1 is a perspective view, FIG. 2 is a plan view, and FIGS. 3 and 4 are cross-sectional views taken along line A-A' and line B-B' of FIG. 2. FIG. 5 is a graph illustrating a coupling ratio based on the length of a control plug in the nonvolatile memory device in accordance with the embodiment.

As illustrated in FIGS. 1 to 4, the nonvolatile memory device in accordance with the embodiment may include a first well 103 with a first conductive type and a second well 105 with a second conductive type. The first well 103 may be formed in the substrate 101, and the second well 105 may be formed in the substrate 101 and include the first well 103. The substrate 101 may include a semiconductor substrate. The semiconductor substrate may include a silicon-containing material having a single crystal state. For example, the substrate 101 may include a bulk silicon substrate or SOI (Silicon On Insulator) substrate in which a support substrate, a buried insulating layer, and a single crystal silicon layer are sequentially stacked.

The first and second wells 103 and 105 provide an electrical base on which a memory device can be operated, and include an impurity region formed through an ion implantation process. The first well 103 may include an isolated well corresponding to each unit cell and the second well 105 may include a deep well having a larger area and depth than the first well 103. For reference, in a memory cell array in accordance with the embodiment, the second well 105 may include a plurality of first wells 103, or a plurality of unit cells may share one first well 103.

The nonvolatile memory device in accordance with the embodiment may include a well tap 109 and an isolation layer 107. The Isolation layer 107 may define a well tap 109, and the well tap 109 may be formed in the substrate 101 so as to apply a predetermined bias to the first well 103. And the isolation layer 107 may define an active region 111 for a program operation, an erase operation, and a read operation. The isolation layer 107 may be formed through an STI (Shallow Trench Isolation) process. For example, the isolation layer 107 may include an isolation trench formed in the substrate 101 and an insulating material gap-filling the isolation trench.

The well tap 109 and the active region 111 which are defined by the isolation layer 107 may be formed in a bar shape having a major axis and a minor axis. The major axis of the active region 111 may be axis extended in a first direction, and the major axis of the well tap 109 may be extended in a second direction. That is, the major-axis direction of the well tap 109 and the major-axis direction of the active region 111 may cross each other. This is in order to improve the integration degree of the unit cell and the integration degree of the memory cell array in accordance with the embodiment. Although not illustrated, parts of the well tap 109 and the active region 111 may protrude in the minor-axis directions thereof, in order to secure an area for forming a contact. FIGS. 1 to 4 do not illustrate a contact plug which is formed over the well tap 109 so as to apply a predetermined bias to the first well 103 through the well tap 109.

The nonvolatile memory device in accordance with the embodiment may include a multi finger-type floating gate FG, a control plug 121, and a charge blocking layer 117. The multi finger-type floating gate FG may be formed over the substrate 101 and include a plurality of fingers FG1 and FG2. The control plug 121 may be formed adjacent to the floating gate FG with a gap 133 provided therebetween. The charge blocking layer 117 may be formed on the sidewalls of the floating gate FG so as to fill the gap 133.

The floating gate FG may serve to store logic information. The plurality of fingers FG1 and FG2 in the floating gate FG may serve to secure the maximum coupling ratio between the floating gate and the control plug within a limited area. Most part of the floating gate FG including the plurality of fingers FG1 and FG2 may be formed over the isolation layer 107, and the other part of the floating gate FG may be extended over the active region 111. That is, the floating gate FG over the active region 111 may be extended over the isolation layer 107, and the floating gate FG extended over the isolation layer 107 may include the plurality of divaricate fingers FG1 and FG2. Each of the fingers FG1 and FG2 may be formed in a bar shape, and have a major axis extended in the first direction. This structure may easily increase an area in which the sidewall of the floating gate FG including the plurality of fingers FG1 and FG2 faces the sidewall of the control plug 121. Furthermore, in the memory cell array in accordance with the embodiment, the structure may lower the level of difficulty for layout or design in a conductive line (for example, control line or bit line).

In the floating gate FG, the plurality of fingers FG1 and FG2 may have various geometric shapes in order to increase the area of the sidewall facing the control plug 121. Furthermore, with the decrease in the interval between the floating gate FG and the control plug 121, that is, the critical dimension (CD) of the gap 133, the coupling ratio between the control plug 121 and the floating gate FG may increase. Furthermore, since the CD of the gap 133 decreases as the integration degree of the nonvolatile memory device increases, the coupling ratio between the control plug 121 and the floating gate FG can be easily increased.

The floating gate FG may include a stacked structure in which a gate dielectric layer 113 and a gate electrode 115 are sequentially stacked. The gate dielectric layer 113 may include any one single layer or two or more layers selected from the group consisting of oxide, nitride, and oxynitride. The gate electrode 115 may include a silicon containing material, for example, a polysilicon layer or/and a metallic layer. In the present embodiment the floating gate FG may have a planar gate structure. However, the floating gate FG may have a 3D gate structure, for example, a fin gate structure.

The control plug 121 may serve as a control gate for the floating gate FG. That is, the floating gate FG may operate in response to a bias applied to the control plug 121. The control plug 121 may be formed together with contact plugs 129 and 131, and have a shape to pass through an interlayer dielectric layer 119 formed on the entire surface of the substrate 101. For reference, in the memory cell array in accordance with the embodiment, a control line coupled to the control plug 121 may be positioned over the interlayer dielectric layer 119.

In order to improve the coupling ratio between the floating gate FG and the control plug 121, the control plug 121 may have various geometrical shapes like the floating gate FG. The control plug 121 may be arranged adjacent to the plurality of fingers FG1 and FG2 with the gap 133 provided therebetween, in order to secure the maximum coupling ratio within a limited area. The control plug 121 may include a first control plug 121A and a second control plug 121B. The first control plug 121A may be formed between the plurality of fingers FG1 and FG2 and have sidewalls facing the inner walls of the fingers FG1 and FG2, and the second control plug 121B may be formed outside the floating gate FG and have a sidewall facing the outer wall of the finger FG1 or FG2. Each of the first and second control plugs 121A and 121B may include one or more plugs having sidewalls facing the plurality of fingers FG1 and FG2. In order to increase the area of the sidewalls facing each other, the first and second control plugs 121A and 121B may have a bar shape of which the major axis is extended in the first direction in which the plurality of fingers FG1 and FG2 are extended. The first and second control plugs 121A and 121B may have the same length, or the second control plug 121B may have a larger length than the first control plug 121A. FIG. 5 indicates that a memory cell including the first and second control plugs 121A and 121B has a larger coupling ratio than a memory cell including only the first control plug 121A. Furthermore, when supposing that the first and second control plugs 121A and 121B have the same length, the coupling ratio increases as the length of the control plug 121 increases. This indicates that the coupling ratio increases with the increase in area of the sidewalls facing each other in the control plug 121 and the floating gate FG. For reference, adjacent unit cells arranged in parallel to each other in the memory cell array in accordance with the embodiment may share the second control plug 121B. This structure may improve the integration degree and the coupling ratio at the same time (refer to FIGS. 5 and 9).

As the control plug 121 is arranged adjacent to the plurality of fingers FG1 and FG2 with the gap 133 provided therebetween, the control plug 121 may be positioned over the isolation layer 107. As the control plug 121 is positioned over the isolation layer 107, it is possible to increase the degree of freedom for a bias which is applied to the control plug 121 so as to operate the floating gate FG. That is, since the control plug 121 is positioned over the isolation layer 107, the control plug 121 may be free from the polarity of the bias applied to the control plug 121 (for example, positive or negative). This structure may secure the diversity of a memory cell operation method.

The charge blocking layer 117 may serve as an insulating layer to insulate the floating gate FG from the control plug 121. Thus, the charge blocking layer 117 may contain an insulating material, and include any one single layer or two or more layers selected from the group consisting of oxide, nitride, and oxynitride. For example, the charge blocking layer 117 may include an ONO (Oxide-Nitride-Oxide) layer. The charge blocking layer 117 may have a shape to fill the interval between the floating gate FG and the control plug 121, that is, the gap 133, and include a spacer formed at the sidewalls of the floating gate FG. For example, the charge blocking layer 117 may be formed through a spacer formation process as a predetermined logic process, in order to protect the sidewalls of the floating gate FG.

The nonvolatile memory device in accordance with the embodiment may include a select gate SG, a first impurity region 123, a second impurity region 125, and a third impurity region 127. The select gate SG may be formed over the active region 111 so as to be isolated from the floating gate FG. The first impurity region 123 with the second conductive type may be formed at one end of the active region 111 adjacent to the floating gate FG. The second impurity region 125 with the second conductive type may be formed at the other end of the active region 111 adjacent to the select gate SG. The third impurity region 127 with the second conductive type may be formed at the active region 111 between the floating gate FG and the select gate SG. Furthermore, the nonvolatile memory device may include the first and second contact plugs 129 and 131 connected to the first and second impurity regions 123 and 125, respectively, through the interlayer dielectric layer 119.

The select gate SG may serve to prevent over-erase. The select gate SG may be formed together with the floating gate FG. Thus, the select gate SG may have a stacked structure of the gate dielectric layer 113 and the gate electrode 115. Furthermore, the charge blocking layer 117 may also be formed on the sidewalls of the select gate SG. In the present embodiment, the select gate SG may have a planar gate structure. However, the select gate SG may have a 3D gate structure, for example, a fin gate structure.

The first to third impurity regions 123 to 127 may be formed through an ion implantation process. The first and second impurity regions 123 and 125 may be set to a drain region and a source region. Thus, the first contact plug 129 may be set to a drain contact plug, and the second contact plug 131 may be set to a source contact plug. The third impurity region 127 may serve to connect a channel by the floating gate FG to a channel by the select gate SG. The first to third impurity regions 123 to 127 may have an LDD (lightly dopederain) structure including a high-concentration impurity region and a low-concentration impurity region. For reference, in the memory cell array in accordance with the embodiment, a bit line coupled to the first contact plug 129 and a source line coupled to the second contact plug 131 may be positioned over the interlayer dielectric layer 119.

As described above, the nonvolatile memory device in accordance with the embodiment may include the control plug 121 for coupling the floating gate FG, thereby improving the operation characteristic and integration degree thereof. Furthermore, since the floating gate FG has the plurality of fingers FG1 and FG2 and the control plug 121 is arranged adjacent to the plurality of fingers FG1 and FG2, the operation characteristic and integration degree of the nonvolatile memory device can be improved more effectively. Specifically, the nonvolatile memory device in accordance with the embodiment may be formed to have a smaller area and a larger coupling ratio than publicly known nonvolatile memory devices, for example, a single gate EEPROM, a stack gate EEPROM, a dual gate EEPROM, and a split gate EEPROM, when supposing that the nonvolatile memory devices have the same coupling ratio or the same unit cell area.

Furthermore, the nonvolatile memory device in accordance with the embodiment may be free from the polarity of a bias applied to the control plug 121, because the control plug 121 is positioned over the isolation layer 107. Thus, the size of a peripheral circuit to supply a bias to a memory cell can be reduced, and publicly known various operating methods can be easily applied.

Furthermore, the nonvolatile memory device in accordance with the embodiment can be implemented through predetermined logic processes without an additional process.

Figure 7:
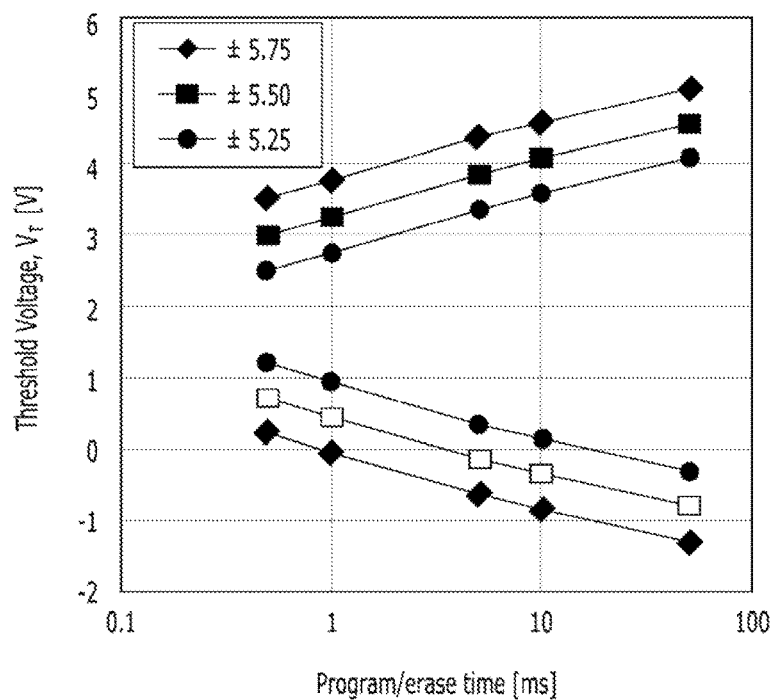
FIG. 7 is a graph illustrating a change of a threshold voltage based on a program/erase time in the nonvolatile memory device in accordance with the embodiment.
Figure 8:
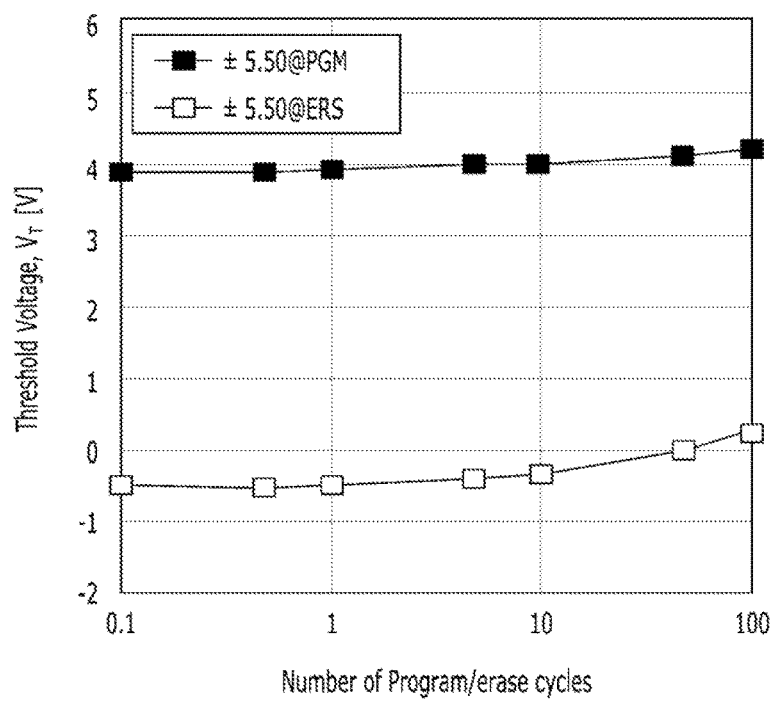
FIG. 8 is a graph illustrating a change of a threshold voltage based on the number of program/erase cycles in the nonvolatile memory device in accordance with the embodiment.

Hereafter, an operating method of the nonvolatile memory device in accordance with the embodiment will be described with reference to FIGS. 6 to 8. FIG. 6 is a table showing an operating condition of the nonvolatile memory device in accordance with the embodiment. FIG. 7 is a graph illustrating a change of a threshold voltage based on a program/erase time in the nonvolatile memory device in accordance with the embodiment. FIG. 8 is a graph illustrating a change of a threshold voltage based on the number of program/erase cycles in the nonvolatile memory device in accordance with the embodiment.

For reference, the nonvolatile memory device in accordance with the embodiment may apply a HCI (Hot Carrier Injection) method or FN tunneling method during a program operation, and apply a BTBT (Band To Band Tunneling) method or FN tunneling method during an erase operation. FIG. 6 shows an example of an operating condition of the nonvolatile memory device in accordance with the embodiment, illustrating the case in which the FN tunneling method is used during a program/erase operation. This is because the FN tunneling method requires a larger coupling ratio for the floating gate FG than the HCI method and the BTBT method. As in embodiment, only when a sufficient coupling ratio is secured, an operation using the FN tunneling method can be performed.

Referring to FIGS. 6 and 8, a program operation, an erase operation, and a read operation of the nonvolatile memory device in accordance with the embodiment will be described as follows.

First, the program operation may use the FN tunneling method. For example, a memory cell may be programmed by applying a positive pumping voltage VPP to the control plug 121 and applying a negative pumping voltage −VPP to the first contact plug 129 coupled to the first well 103, the select gate SG, and the bit line, in a state where the second contact plug 131 coupled to the source line is floated. The pumping voltage ±VPP may include a voltage obtained by boosting a power supply voltage VCC supplied from outside. The reason that the same negative pumping voltage −VPP is applied to the select gate SG and the first contact plug 129 is in order to prevent interference between operations.

Specifically, when the power supply voltage VCC is 3.3V and a floating gate threshold voltage difference of at least 4V or more is required to sense whether the memory cell was programmed, the absolute value of the pumping voltage ±VPP may be set to 5.5V, and the program time may be set to 10 ms.

Next, the erase operation may use the FN tunneling method. For example, a memory cell may be erased by applying the negative pumping voltage −VPP to the control plug 121 and applying the positive pumping voltage VPP to the first well 103, the select gate SG, and the first contact plug 129, in a state where the second contact plug 131 is floated. The reason that the same positive pumping voltage VPP is applied to the select gate SG and the first contact plug 129 is in order to prevent interference between operations.

Specifically, when the power supply voltage VCC is 3.3V and a floating gate threshold voltage difference of at least 4V or more is required to sense whether the memory cell was erased, the absolute value of the pumping voltage ±VPP may be set to 5.5V, and the erase time may be set to 10 ms.

As such, the nonvolatile memory device in accordance with the embodiment may over-drive the power supply voltage VCC of 3.3V used in a logic circuit up to 5.5V and thus perform the program operation and the erase operation without an additional high voltage element.

Next, during the read operation, the power supply voltage VCC and a read voltage Vread may be applied to the select gate SG and the first contact plug 129 and an internal voltage Vint may be applied to the control plug 121 in a state where a ground voltage GND is applied to the second contact plug 131 and the first well 103. The internal voltage Vint may be smaller than the power supply voltage VCC and larger than the read voltage Vread. This is in order to couple the floating gate FG to such an extent that a threshold voltage difference can be sensed.

Specifically, when the power supply voltage VCC is 3.3V, the read voltage Vread may be set to 1V and the internal voltage Vint may be set to 1.5V.

Figure 9:
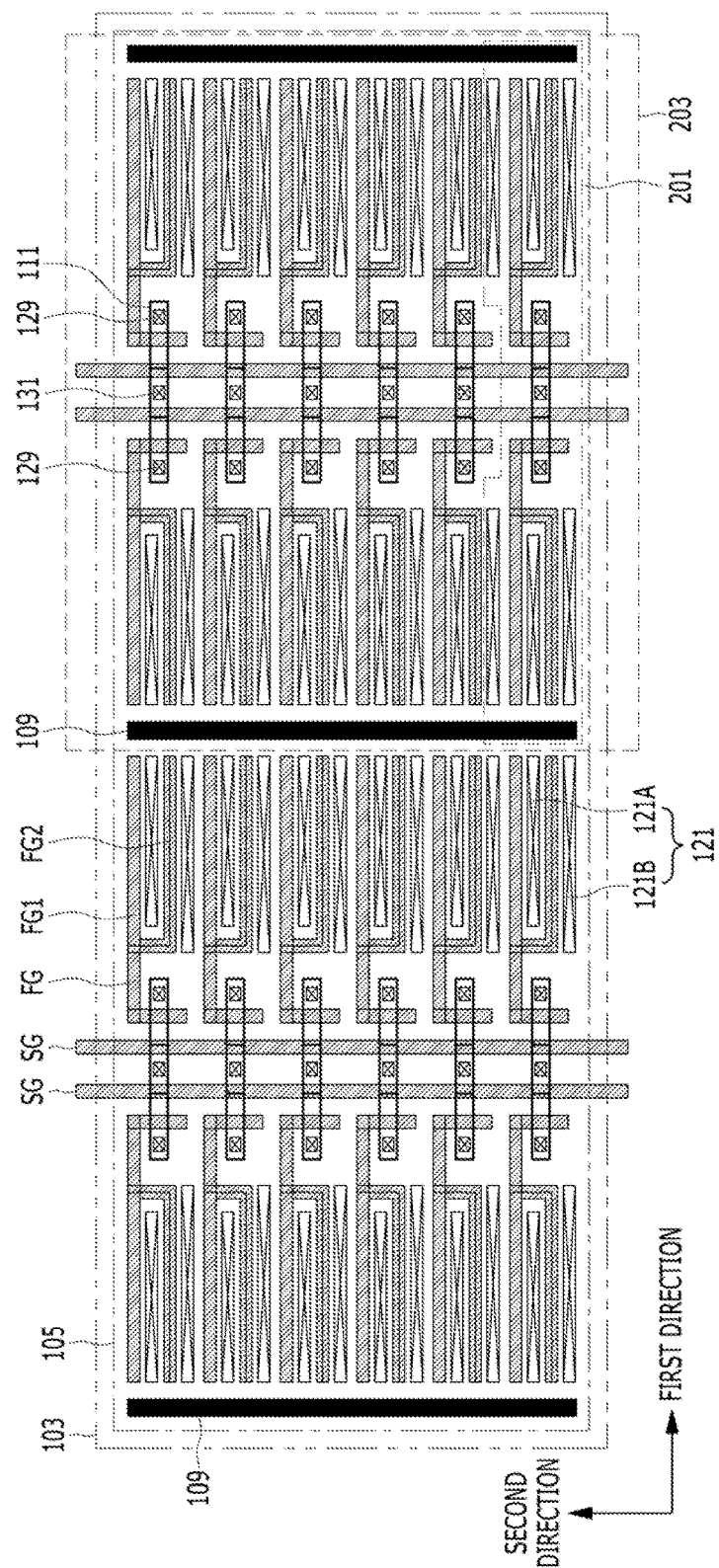
FIG. 9 is a plan view illustrating a cell array of a semiconductor memory device in accordance with an embodiment.

FIG. 9 is a plan view illustrating a cell array of a semiconductor memory device in accordance with an embodiment. Hereafter, unit cells forming the cell array of the nonvolatile memory device will be described using reference numerals of FIGS. 1 to 4, for convenience of description. Furthermore, the detailed descriptions of components having the same reference numerals are omitted herein.

As illustrated in FIGS. 1 to 4 and FIG. 9, the nonvolatile memory device in accordance with the embodiment may include a cell array in which a plurality of unit cells are two-dimensionally arranged. Each of the unit cells may include a first well 103, an isolation layer 107, a control plug 121, a floating gate FG, a charge blocking layer 117, and a select gate SG. The first well 103 may be formed in a substrate 101. The isolation layer 107 may be formed in the substrate 111 so as to define a well tap 109 and an active region 111. The control plug 121 may be formed over the isolation layer 107 and include first and second control plugs 121A and 121B. The floating gate FG may be formed over the substrate and include a plurality of fingers FG1 and FG2 adjacent to the contra plug 121 with a gap 133 provided therebetween. The charge blocking layer 117 may be formed on the sidewalls of the floating gate FG so as to fill the gap 133. The select gate SG may be formed over the active region 111. In the unit cell, the active region 111, the plurality of fingers FG1 and FG2, and the control plug 121 may have a bar shape of which the major axis is extended in a first direction, and the well tap 109 may have a bar shape of which the major axis is extended in a second direction crossing the first direction.

The cell array of the nonvolatile memory device in accordance with the embodiment may include a memory set 201 which has two unit cells sharing one active region 111 in the first direction and the well tap 109 positioned at both ends thereof.

The active region 111 shared by two unit cell in the memory set 201 may be formed in such a shape that active region 111 of two unit cells are coupled to each other so as to the second impurity region, that is, the source region. Hereafter, the source region shared by two unit cells will be referred to as a common source region. The common source region may be coupled to the second contact plug 131. Thus, two unit cells in the memory set 201 may be arranged to be symmetrical with each other in the first direction, based on the common source region. Specifically, the select gate SG, the floating gate FG, and the first contact plug 129 may be sequentially arranged in the first direction, based on the common source region or the second contact plug 131.

The cell array of the nonvolatile memory device in accordance with the embodiment may include a plurality of memory groups 203 each having a plurality of memory sets 201 which are arranged to be separated at a predetermined interval from each other in the second direction. The unit cells adjacent to each other in the second direction may share the second control plug 121B positioned outside the floating gate FG. The select gates SG in the respective memory sets 201 may be coupled to each other and serve as a conductive line extended in the second direction, for example, a select line in the memory group 203. Furthermore, the well taps 109 in the respective memory sets 201 may also be coupled to each other and have a line shape extended in the second direction in the memory group 203.

Although not illustrated, the memory group 203 may include a plurality of control line, a plurality of bit line, and a plurality of source lines. Each of the plurality of the control line may be extended in the second direction so as to be coupled to the plurality of control plugs 121. Each of the plurality of the bit line may be extended in the second direction so as to be coupled to the plurality of first contact plugs 129. Each of the plurality of source lines may be coupled in the first direction so as to couple to the second contact plug 131. The control line and the bit line may be formed in the same wiring layer (for example, M1), and the source lines crossing the control line and the bit line may be formed in another wiring layer (for example, M2).

In the cell array of the nonvolatile memory device in accordance with the embodiment, the plurality of memory groups 203 may be arranged to be symmetrical with each other in the first direction, based on the well tap 109 having a line shape extended in the second direction.

In accordance with the embodiments, the nonvolatile memory device may include the control plug for coupling the floating gate, thereby improving the operation characteristic and integration degree thereof. Furthermore, since the floating gate includes the plurality of fingers and the control plug is arranged adjacent to the plurality of fingers, the operation characteristic and integration degree of the nonvolatile memory device can be improved more effectively.

Furthermore, as the control plug is positioned over the isolation layer, the control plug may be free from the polarity of a bias applied to the control plug. Thus, the size of a peripheral circuit to supply a bias to a memory cell may be educed and publicly known operating methods can be easily applied.

Furthermore, the nonvolatile memory device can be implemented through predetermined logic processes without an additional process.

Although various embodiments have been described for illustrative purposes, it will be apparent to those skilled in the art that various changes and modifications may be made without departing from the spirit and scope of the invention as defined in the following claims.

What is claimed is:

1. A nonvolatile memory device comprising:
a well formed in a substrate;
an isolation layer formed in the substrate and defining an active region and a well tap of the well, the active region and the well tap being separated from each other and having a bar shape with a major-axis direction of the well tap and a major-axis direction of the active region crossing each other:
a control plug formed over the isolation layer to overlap the isolation layer;
a floating gate formed over the substrate and comprising a plurality of fingers adjacent to the control plug with a gap provided therebetween, wherein the plurality of fingers are formed over the isolation layer to overlap the isolation layer; and
a charge blocking layer formed on the sidewalls of the floating gate so as to fill the gap,
wherein the control plug comprises:
a first control plug formed between the plurality of fingers and having sidewalls facing inner walls of the fingers; and
plurality of separated second control plugs formed outside the floating gate and having sidewalls facing outer walls of the fingers, and
wherein the control plug and the fingers are positioned between the active region and the well tap;
wherein a part of the floating gate is extended over the active region from the plurality of fingers over the isolation layer having the same major-axis direction of the well tap and a select gate formed over the active region having the same major-axis direction of the well tap.

2. The nonvolatile memory device of claim 1, wherein the part of the floating gate over the active region is separated at a predetermined interval from the select gate.

3. The nonvolatile memory device of claim 1, wherein the plurality of fingers, the control plug, and the active region are formed in a bar shape, and have the same major-axis direction of the active region.

4. The nonvolatile memory device of claim 1, wherein the first control plug and the plurality of second control plugs have same length.

5. The nonvolatile memory device of claim 1, wherein the charge blocking layer comprises an insulating layer, and has a spacer shape.

6. A nonvolatile memory device comprising a cell array in which a plurality of unit cells are two-dimensionally arranged, wherein each of the unit cells comprises:
a well formed in a substrate;
an isolation layer formed in the substrate and defining an active region and a well tap of the well, the active region and the well tap being separated from each other and having a bar shape with a major-axis direction of the well tap and a major-axis direction of the active region crossing each other;
a control plug formed over the isolation layer to overlap the isolation layer;
a floating gate formed over the substrate and comprising a plurality of fingers adjacent to the control plug with a gap provided therebetween, wherein the plurality of fingers are formed over the isolation layer to overlap the isolation layer; and
a charge blocking layer formed on the sidewalls of the floating gate so as to fill the gap,
wherein the control plug comprises:
a first control plug formed between the plurality of fingers and having sidewalls facing inner walls of the fingers; and
plurality of second control plugs formed outside the floating gate and having sidewalls facing outer walls of the fingers; and
wherein the control plug and the fingers are positioned between the active region and the well tap, wherein a part of the floating gate is extended over the active region from the plurality of fingers over the isolation layer having the same major-axis direction of the well tap and a select gate formed over the active region having the same major-axis direction of the well tap and
wherein the cell array comprises:
a plurality of memory sets each comprising two unit cells sharing one active region in a first direction and the well tap positioned at both ends thereof; and
a plurality of memory groups each comprising the plurality of memory sets arranged to be separated at a predetermined interval from each other in a second direction crossing the first direction, and
the plurality of memory groups are arranged to be symmetrical with each other, based on the well tap.

7. The nonvolatile memory device of claim 6, wherein each of the unit cells further comprises the select gate over the active region.

8. The nonvolatile memory device of claim 7, wherein the select gates of the plurality of memory sets in the memory group are coupled in the second direction so as to form a select line.

9. The nonvolatile memory device of claim 6, wherein the active region, the plurality of fingers, and the control plug have a bar shape of which the major axis is extended in the first direction, and the well tap has a bar shape of which the major axis is extended in the second direction.

10. The nonvolatile memory device of claim 6, wherein the control plug comprises one or more plugs having sidewalls facing the sidewalls of the floating gate.

11. The nonvolatile memory device of claim 6, wherein the first control plug and the plurality of the second control plugs have same length.

12. The nonvolatile memory device of claim 6, wherein unit cells adjacent in the second direction in the memory group share the plurality of the second control plugs.

13. The nonvolatile memory device of claim 6, wherein the active region in the memory set comprises a shape in which active regions of two unit cells are coupled to share a source region.

14. The nonvolatile memory device of claim 6, wherein the well taps of the plurality of memory sets in the memory group are coupled in the second direction so as to have a line shape.

* * * * *